United States Patent
Adolf et al.

(10) Patent No.: US 10,761,155 B2
(45) Date of Patent: Sep. 1, 2020

(54) HYBRID AVERAGING METHOD FOR SPECIFIC ABSORPTION RATE SUPERVISION

(71) Applicants: Holger Adolf, Zirndorf (DE); Thomas Benner, Erlangen (DE); Jörg Ulrich Fontius, Neunkirchen A. Brand (DE); Rene Gumbrecht, Herzogenaurach (DE)

(72) Inventors: Holger Adolf, Zirndorf (DE); Thomas Benner, Erlangen (DE); Jörg Ulrich Fontius, Neunkirchen A. Brand (DE); Rene Gumbrecht, Herzogenaurach (DE)

(73) Assignee: Siemens Aktiengesellschaft, Munich (DE)

(*) Notice: Subject to any disclaimer, the term of this patent is extended or adjusted under 35 U.S.C. 154(b) by 1548 days.

(21) Appl. No.: 14/332,070

(22) Filed: Jul. 15, 2014

(65) Prior Publication Data

US 2015/0022206 A1 Jan. 22, 2015

Related U.S. Application Data

(60) Provisional application No. 61/847,037, filed on Jul. 16, 2013, provisional application No. 61/860,880, filed on Jul. 31, 2013.

(51) Int. Cl.
*G01V 3/00* (2006.01)
*G01R 33/28* (2006.01)
*G01R 33/32* (2006.01)

(52) U.S. Cl.
CPC ............ *G01R 33/288* (2013.01); *G01R 33/32* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 5,349,296 A * 9/1994 Cikotte ................ G01R 33/54
  324/309
6,687,527 B1 * 2/2004 Wu ...................... G01R 33/546
  324/318

(Continued)

OTHER PUBLICATIONS

Gumbrecht et al., Online Local SAR Supervision for Transmit Arrays at 7T, Siemens Healthcare, Nov. 2012.
(Continued)

*Primary Examiner* — Walter L Lindsay, Jr.
(74) *Attorney, Agent, or Firm* — Lempia Summerfield Katz LLC

(57) ABSTRACT

In order to reduce the memory footprint used for monitoring specific absorption rate (SAR) in a magnetic resonance imaging (MRI) system, a hybrid sliding window method is provided. The method includes receiving a measured value once every first time interval, processing the measured value, and storing a value resulting from the processing in a first memory element. Measured values stored in second memory elements are summed every second time interval, where the first time interval is less than the second time interval. A representation of SAR is calculated every first time interval based on the value resulting from the processing and the sum of the measured values of the second memory elements. When the second time interval is reached, the value stored in the first memory element is moved to one of the second memory elements, and the value stored in the first memory element is reset to zero.

22 Claims, 4 Drawing Sheets

(58) Field of Classification Search
USPC .................. 324/300–322; 382/128–131; 600/407–435
See application file for complete search history.

(56) References Cited

U.S. PATENT DOCUMENTS

| | | | | |
|---|---|---|---|---|
| 7,622,921 | B2* | 11/2009 | Fontius | G01R 33/5612 |
| | | | | 324/307 |
| 8,890,524 | B2* | 11/2014 | Boernert | G01R 33/288 |
| | | | | 324/307 |
| 9,229,072 | B2* | 1/2016 | Gebhardt | G01R 33/26 |
| 2008/0157765 | A1* | 7/2008 | Fontius | G01R 33/3415 |
| | | | | 324/309 |
| 2010/0327868 | A1 | 12/2010 | Gebhardt et al. | |
| 2011/0224924 | A1 | 9/2011 | Eichfelder et al. | |
| 2011/0263969 | A1 | 10/2011 | Fontius | |
| 2012/0019247 | A1* | 1/2012 | Boernert | G01R 33/288 |
| | | | | 324/309 |
| 2012/0137119 | A1* | 5/2012 | Doerr | G06F 21/575 |
| | | | | 713/100 |
| 2012/0238861 | A1* | 9/2012 | Gebhardt | G01R 33/26 |
| | | | | 600/410 |
| 2012/0256626 | A1 | 10/2012 | Adalsteinsson et al. | |
| 2014/0125333 | A1* | 5/2014 | Hanada | G01R 33/56518 |
| | | | | 324/307 |
| 2015/0022206 | A1* | 1/2015 | Adolf | G01R 33/288 |
| | | | | 324/309 |

OTHER PUBLICATIONS

Gumbrecht et al., Safe Online Local SAR Calculation for Transmit Arrays Using Asynchron Data Processing, Siemens Healthcare, Nov. 2012.
MAGNETOM 7T, TimTX Array Step 2, 6 pages, www.siemens.com/7T-MRI, Aug. 2012.
Siemens, MAGNETOM 7T, Operator Manual—Tx Array System, pp. 43-66, circulated internally in Jun. 2012 and circulated externally in Jul. 31, 2012.

* cited by examiner

HYBRID AVERAGING METHOD FOR SPECIFIC ABSORPTION RATE SUPERVISION

This application claims the benefit of provisional patent application No. 61/847,037, filed on Jul. 16, 2013, and provisional patent application No. 61/860,880, filed on Jul. 31, 2013, the entire contents of which are hereby incorporated by reference in their entirety.

FIELD

The present embodiments relate to hybrid averaging for monitoring specific absorption rate (SAR) for magnetic resonance imaging (MRI).

BACKGROUND

Newer-generation magnetic resonance imaging (MRI) systems may generate and transmit individual radio-frequency (RF) pulse trains in parallel over different independent radio-frequency transmit channels. Individual RF signals are applied to the individual transmit channels (e.g., the individual rods of a whole-body antenna).

Parallel transmission techniques, however, may increase peak pulse power, giving rise to concerns regarding excessive exposure to RF energy. The RF energy from an MRI scan may cause heating of the tissue of a body. One measure of RF absorption is the specific absorption rate (SAR), which specifies the deposited power per unit mass (watts/kg) due to the RF pulse. Inhomogeneity of an RF field (e.g., generated by the whole-body antenna) leads to one or more local exposures (e.g., hot spots) where a majority of the absorbed energy is applied (e.g., local SAR). Maximum values for SAR are specified by safety regulations and are to be met both globally (e.g., power absorbed by the whole body, such as the head of a patient) and locally (e.g., power absorbed per 10 grams of tissue). For example, a standardized limit of 3.2 watts/kg applies to the global SAR of a patient, and a standardized limit of 10 watts/kg applies to the local SAR per 10 grams of tissue in the head of the patient, according to an International Electrotechnical Commission (IEC) standard. For patient safety, SAR is monitored over the course of an MRI scan. Prior art techniques for monitoring SAR may require a large memory footprint that is expensive.

SUMMARY

In order to reduce the memory footprint used for monitoring specific absorption rate (SAR) in a magnetic resonance imaging (MRI) system, a hybrid sliding window method is provided. The method includes receiving a measured value once every first time interval, processing the measured value, and storing a value resulting from the processing in a first memory element. Measured values stored in second memory elements are summed every second time interval, where the first time interval is less than the second time interval. A representation of SAR is calculated every first time interval based on the value resulting from the processing and the sum of the measured values of the second memory elements. When the second time interval is reached, the value stored in the first memory element is moved to one of the second memory elements, and the value stored in the first memory element is reset to zero.

In one aspect, a method for monitoring SAR in an MRI system includes identifying a number of memory elements to be used. The memory elements include at least one static memory element and a dynamic memory element. A value stored in the dynamic memory element is changeable once every first time interval. A value stored in the at least one static memory element is changeable once every second time interval. The second time interval is greater than the first time interval. A measured value is received once every first time interval. The measured value is processed, and a result of the processing is stored in the dynamic memory element after each first time interval. A processor moves the result of the processing stored in the dynamic memory element to one of the at least one static memory element when the second time interval is reached.

In another aspect, a non-transitory computer-readable storage medium stores instructions executable by one or more processors to monitor SAR in an MRI system including a number of memory elements to be used. The instructions include receiving data representing a value once every first time interval, processing the data, and storing a value resulting from the processing in a first memory element of the number of memory elements after each first time interval. A sum is calculated based on the value stored in the first memory element and a value stored in a second memory element of the number of memory elements after each first time interval. The value stored in the first memory element is moved to the second memory element when the second time interval is exceeded or reached. The calculated sum or a representative of SAR in the MRI system calculated based on the sum is compared to a predetermined threshold after each first time interval.

In yet another aspect, a system for monitoring SAR in an MRI system includes a processor configured to identify a value representative of SAR once every first time interval. The system also includes a plurality of memory elements including at least one static memory element and a dynamic memory element. A value stored in the dynamic memory element is changeable once every first time interval. A value stored in the at least one static memory element is changeable once every second time interval. The second time interval is greater than the first time interval. The processor is further configured to calculate a representation of SAR in the MRI system each first time interval based on the value stored in the dynamic memory and the value stored in the at least one static memory. The processor is also configured to change the value stored in one of the at least one static memory element the value stored in the dynamic memory element when or after the second time interval is reached.

In another aspect, a method for monitoring SAR in an MRI system is provided. The method includes identifying a number of memory elements. The number of memory elements include at least one static memory element and a dynamic memory element. A value stored in the dynamic memory element is changeable every first time interval, and at least one value stored in the at least one static memory element, respectively, is changeable every second time interval. The second time interval is greater than the first time interval. A measured value is received every first time interval. The measured value is processed, and a value resulting from the processing is stored in the dynamic memory element every first time interval until the second time interval is reached. A processor calculates a representation of SAR in the MRI system based on the at least one value stored in the at least one static memory element and the value stored in the dynamic memory element after each first time interval. The processor moves the value stored in the dynamic memory element to one of the at least one static memory element when or after the second time interval is reached. The value stored in the dynamic memory element is set to zero when or after the second time interval is reached.

DETAILED DESCRIPTION

Figure 1:
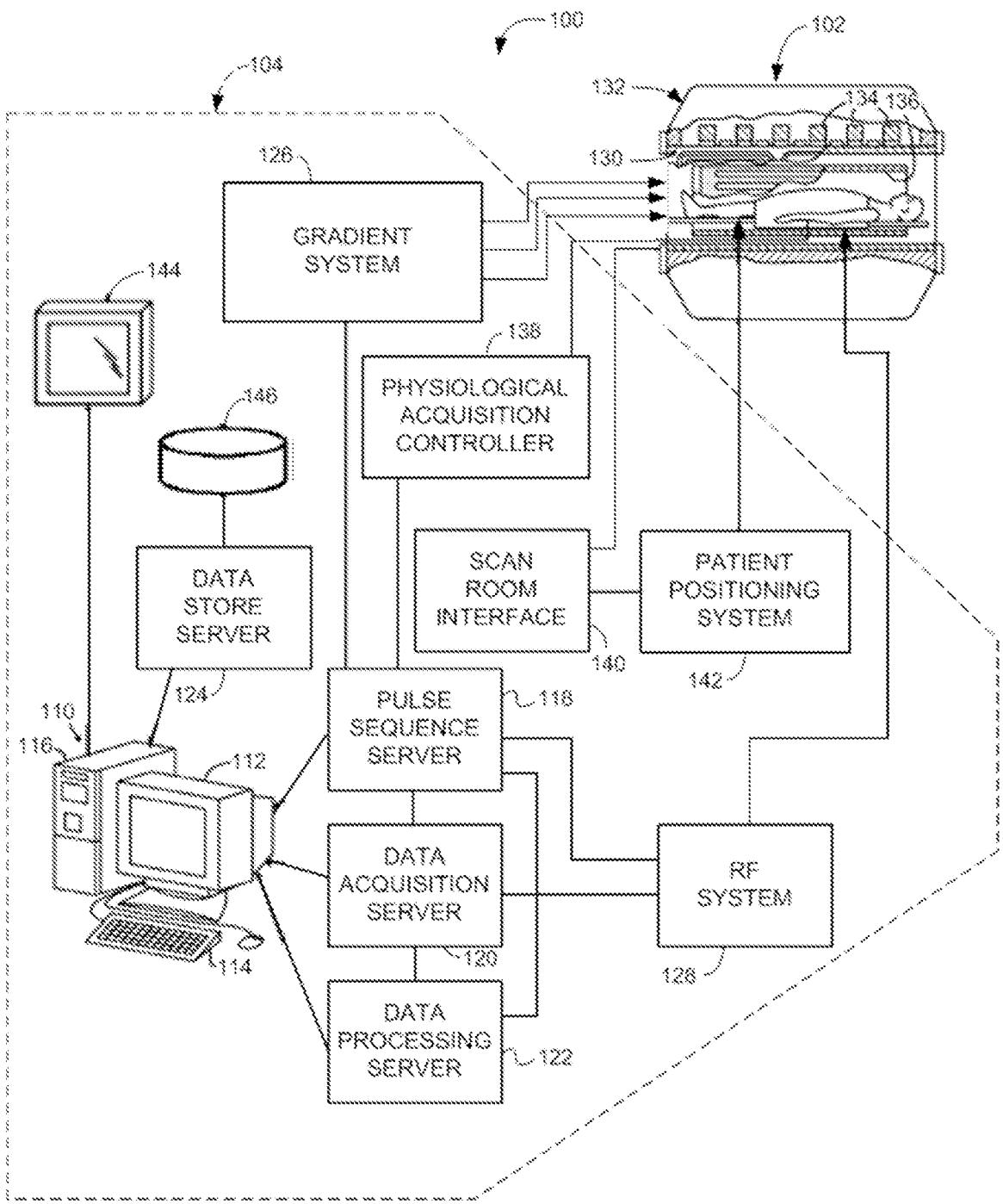
FIG. 1 illustrates one embodiment of a magnetic resonance imaging (MRI) system.

Newer-generation magnetic resonance imaging (MRI) systems may generate radio frequency (RF) pulses with a spatially tailored excitation pattern to mitigate $B_1^+$ inhomogeneity by exciting a spatial inverse of the inhomogeneity. In these systems, a plurality of individual RF pulse trains are transmitted in parallel over the different independent radio-frequency transmit channels. Individual RF signals are applied to the individual transmit channels (e.g., the individual rods of a whole-body antenna). This method, referred to as "parallel transmission" or "parallel excitation," exploits variations among the different spatial profiles of a multi-element RF coil array. Parallel excitation has enabled several important applications beyond the mitigation of $B_1^+$ inhomogeneity, including flexibly shaped excitation volumes.

Parallel transmission systems allow reduction of the duration of an RF pulse by undersampling the excitation k-space trajectory (reducing the distance traveled in k-space), thus shortening the corresponding RF pulse. The ability to "accelerate" in the k-space domain arises due to the extra degrees of freedom provided by the system's multiple transmit elements.

Parallel transmission techniques, however, may increase peak pulse power, giving rise to concerns regarding excessive exposure to RF energy. In this context, the RF exposure may be defined by a physiological absorption of the RF irradiation, rather than the transmitted RF energy. A typical measure of the radio-frequency absorption is the specific absorption rate (SAR), which specifies the deposited power per unit weight (watts/kg) due to the RF pulse. Maximum values for SAR are specified by safety regulations and are to be met both globally (e.g., power absorbed by the whole head or whole body) and locally (e.g., power absorbed per 10 grams of tissue). For example, a standardized limit of 4 watts/kg applies to the global SAR of a patient according to an International Electrotechnical Commission (IEC) standard.

When multiple transmit channels are simultaneously employed, the local electric fields generated by each channel undergo local superposition, and local extremes in electric field magnitude may arise, leading to spikes in local SAR. The spikes in local SAR may lead to "hot spots," and parallel transmitted pulses may produce relatively high ratios of, for example, local to global average SAR. These relatively high ratios of local to global average SAR make local SAR the limiting factor of parallel transmission MRI.

Parallel transmission (pTx) systems for RF pulses in MRI may generate more flexible magnetization profiles than is feasible with conventional single-channel RF systems. The pTx systems may, however, be limited by SAR constraints.

SAR supervision for MRI systems has been realized by calculating sliding window averages over measured RF power according to the IEC standards. The averages are calculated for several SAR aspects (e.g., global, local, partial body). For update times of, for example, 10 milliseconds, and window sizes of, for example, 10 seconds or 360 seconds, large memory is used (e.g., 1,000 memory elements or 36,000 memory elements, respectively). Because the averaging is safety-relevant and is thus to be done in real-time, components (e.g., field-programmable gate arrays (FPGA)) are used.

Depending on the chosen SAR supervision strategy, sliding averages are to be calculated for each transmit channel separately and/or summed over all transmit channels and thus results in a high number of averages to calculate. Due to the possibility to apply high RF energy to the patient in a short time using multiple transmit channels, the update interval of the sliding window is to be very short (e.g., 10 ms) to allow timely interrupting of RF transmission before causing harm to the patient. Due to the possibly high bandwidth of RF pulses (e.g., when using a transmission array), the RF power sampling time is to be very short (e.g., <μs). To implement these requirements, each sliding window averaging unit (e.g., including field-programmable gate arrays (FPGAs)) includes a large amount of memory to realize update times of, for example, 10 ms for window sizes of, for example, 10 s (e.g., 1,000 memory elements) or 360 s (e.g., 36,000 memory elements). These memory requirements are expensive and take up a large footprint.

To implement these requirements with a lower memory footprint, a hybrid averaging method is provided in one or more of the present embodiments. The hybrid averaging method combines an integration component and a sliding-window component. The window includes N memory elements, where N is smaller than the window size (e.g., 10 s) divided by the sampling time (e.g., the number of received/stored data points representing measured RF power). The number N is defined by the tolerable overestimation (e.g., N=100 for 1% allowed overestimation). The overestimation is defined by the time interval needed to acquire all data for memory element N+1 in comparison with the size of the sliding window. When a new RF power value is measured, the entire window is not updated. Instead, the new RF power value is added to memory element N+1. A window update occurs after a time of window size (e.g., 10 s) divided by N (e.g., 100). The hybrid averaging method of one or more of the present embodiments may be used to monitor SAR in, for example, the MRI system described below in FIGS. 1 and 2.

FIG. 1 shows one embodiment of an MRI system 100. The MRI system 100 may include a scanner or data acquisition unit 102 and a control system 104 for directing the operation of the scanner 102. The control system 104 includes a workstation 110 having one or more output interfaces 112 (e.g., a display) and one or more input interfaces 114 (e.g., a keyboard). The workstation 110 includes a processor 116, which may be a commercially available, programmable machine running a commercially available operating system. The workstation 110 provides an operator interface that enables scan sequences to be entered into or otherwise defined for the control system 104 and the MRI system 100. The workstation 110 may be coupled to a number of servers including, for example, a pulse sequence server 118, a data acquisition server 120, a data processing server 122, and a data store server 124. The workstation 110 and the servers 118, 120, 122 and 124 may communicate with each other via any desired communication technique, protocol, or standard. The components of the control system 104 may be coupled to one another via a data bus or network (not shown) and need not be connected via respective, dedicated communication lines, as shown. Any one or more of the components of the control system 104 may be implemented as a service unit, module, or other unit implemented by a common physical machine or other device. Additional, different, or fewer components may be provided, such as combining two or more servers or providing the workstation functionality on a server or vice versa.

The processor 116 or a processor of any of the servers 118, 120, 122, and 124 is a general processor, a central processing unit, a control processor, a graphics processor, a digital signal processor, a three-dimensional rendering processor, an image processor, an application-specific integrated circuit, a field-programmable gate array, a digital circuit, an analog circuit, combinations thereof, or other now known or later developed devices. The processor is a single device or multiple devices operating in serial, parallel, or separately. The processor may be a main processor of a computer, such as a laptop or desktop computer, or may be a processor for handling some tasks in a larger system. The processor is configured by instructions, design, hardware, and/or software to perform the acts discussed herein, such as monitoring SAR within the MRI system 100.

The pulse sequence server 118 functions in response to instructions downloaded from the workstation 110 to operate a gradient system 126 and an RF system 128. Gradient waveforms to perform the prescribed scan are produced and applied to the gradient system 126. The gradient system 126 excites gradient coils in a gradient coil assembly 130 to produce the magnetic field gradients $G_x$, $G_y$, and $G_z$ used for position-encoding MR signals. The gradient coil assembly 130 forms part of a magnet assembly 132, which includes an annular or other polarizing magnet 134 and a whole-body RF coil array 136. In some cases, the whole-body RF coil array 136 is constructed in the form of a birdcage antenna and has a number of individual antenna rods that run parallel to the patient tunnel and are uniformly distributed in a circumferential arrangement around the patient tunnel. The individual antenna rods may be capacitively coupled to one another in a ring shape at one end of the birdcage antenna.

RF excitation waveforms are applied to the RF coil 136 by the RF system 128 to perform a selected magnetic resonance pulse sequence. Responsive MR signals detected by the RF coil 136 or a separate local coil (not shown) are received by the RF system 128, amplified, demodulated, filtered and digitized under direction of the pulse sequence server 118. The RF system 128 includes an RF transmitter for producing a wide variety of RF pulses used in MR pulse sequences. The RF transmitter is responsive to the selected scan sequence and direction from the pulse sequence server 118 to produce RF pulses of the desired frequency, phase and pulse amplitude waveform. The generated RF pulses may be applied to the whole body RF coil 136 or to one or more local coils or coil arrays. As described below, the RF transmitter includes a plurality of transmission channels to produce RF pulses formed via the superimposition of the RF pulses generated by each transmission channel.

The RF system 128 also includes one or more RF receiver channels. Each RF receiver channel includes an RF amplifier that amplifies the MR signal received by the coil to which the RF receiver channel is connected. Each receiver may also include a detector that collects and digitizes in-phase (I) and quadrature (Q) components of the received MR signal.

The pulse sequence server 118 may receive patient data from a physiological acquisition controller 138. The controller 138 receives signals from a number of different sensors connected to the patient, such as ECG signals from electrodes or respiratory signals from a bellows. Such signals may be used by the pulse sequence server 118 to synchronize, or "gate", the implementation of the scan sequence with the subject's respiration or heart beat.

The pulse sequence server 118 also connects to a scan room interface circuit 140 that receives signals from various sensors associated with the condition of the patient or subject and the magnet system. It is also through the scan room interface circuit 140 that a subject positioning system 142 receives commands to move the subject to desired positions during the scan sequence. The subject positioning system 142 may direct one or more motors (not shown) that drive a bed and, thus, the subject, to a desired position.

The digitized MR signal samples produced by the RF system 128 are received by the data acquisition server 120. The data acquisition server 120 operates in response to instructions downloaded from the workstation 110 to receive the real-time MR data and provide buffer storage such that no data is lost by data overrun. In some scan sequences, the data acquisition server 120 does little more than pass the acquired MR data to the data processor server 122. However, in scans that require information derived from acquired MR data to control the further performance of the scan, the data acquisition server 120 is programmed to produce such information and convey the information to the pulse sequence server 118. For example, during calibration or other pre-scans, MR data is acquired and used to calibrate the pulse sequence performed by the pulse sequence server 118. The calibration data may be stored in a memory or storage device or other unit of, associated with, or in communication with, any of the aforementioned servers or other devices.

Memory of any of the servers may be computer readable storage media. The computer readable storage media may include various types of volatile and non-volatile storage media, including but not limited to random access memory, read-only memory, programmable read-only memory, electrically programmable read-only memory, electrically erasable read-only memory, flash memory, magnetic tape or disk, optical media and the like. The memory may be a single device or a combination of devices. The memory may be adjacent to, part of, networked with and/or remote from the processor.

Navigator signals may be acquired during a scan and used to adjust RF or gradient system operating parameters or to control the view order in which k-space is sampled. The data acquisition server 120 may be employed to process MR signals used to detect the arrival of contrast agent in a magnetic resonance angiography (MRA) scan. In all these examples, the data acquisition server 120 acquires MR data and processes the MR data in real-time to produce information that is used to control the scan.

The data processing server 122 receives MR data from the data acquisition server 120 and processes the MR data in accordance with instructions downloaded from the workstation 110. Alternatively, the data processing server 122 receives the MR data directly from the RF system 128. Such processing may include, for example, Fourier transformation of raw k-space MR data to produce two or three-dimensional images, the application of filters to a reconstructed image, the performance of back-projection image reconstruction of acquired MR data, the calculation of functional MR images, the calculation of motion or flow images, segmentation, or other visualization processes.

Images reconstructed by the data processing server 122 are conveyed back to the workstation 110 for storage. Real-time images may be stored in a database memory cache (not shown) from which the images may be output to the display 112 or an auxiliary terminal or console 144, which may be located near the magnet assembly 132 for use by attending physicians or other operators. Batch mode images or selected real time images are stored in a database on mass storage device 146, which may include any desired storage medium. When such images have been reconstructed and transferred to storage, the data processing server 122 notifies the data store server 124 on the workstation 110. The workstation 110 may be used by an operator to archive the images, produce films, or send the images via a network to other facilities.

Figure 2:
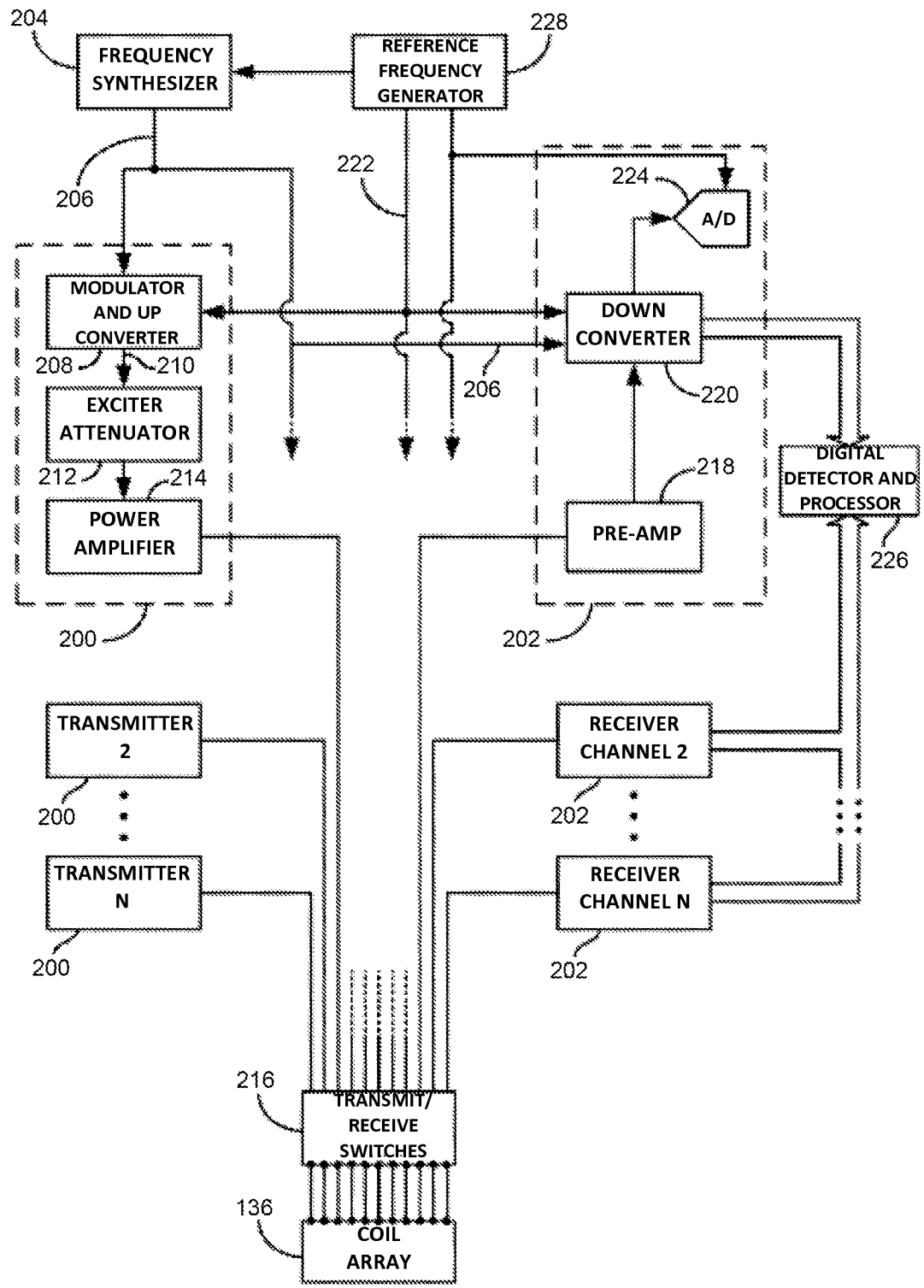
FIG. 2 illustrates one embodiment of a radio frequency (RF) system and other components of the MRI system of FIG. 1.

As shown in FIG. 2, the RF system 128 and other components of the system 100 are shown in greater detail. The whole body coil array 136 may include a plurality of coil elements that may be separately driven by a plurality of RF transmitters 200 to produce a desired RF field-of-excitation ("FOX"). Each RF transmitter 200 forms one of the array of channels that, when superimposed, collectively define the composite RF signal. The coil array 136 may also be used with a plurality of receive channels 202. Alternatively or additionally, another whole body RF coil array (not shown) or another local RF coil may be used to receive the MR signals. A variety of different coil array structures may be used as part of the system 100 (FIG. 1).

The RF system 126 includes a set of transmitters 200, each of which produces an individual, selected RF excitation field. The base, or carrier, frequency of this RF excitation field is produced under control of a frequency synthesizer 204, which receives a set of digital control signals from the pulse sequence server 118. These control signals may include data representative of the frequency and phase of the RF carrier signal, which may be produced at an output 206. The RF carrier is applied to a modulator and up converter 208 in each transmitter 200, where the amplitude of the RF carrier is modulated in response to a signal also received from the pulse sequence server 118. The signal defines the envelope of the RF excitation pulse to be produced and is generated by sequentially reading out a series of stored digital values. These stored digital values may be changed to enable any desired RF pulse envelope to be produced by each transmitter 200.

The magnitude of the RF excitation pulse produced at an output 210 is attenuated by an exciter attenuator circuit 212 in each transmitter 200. Each attenuator circuit 212 receives a digital command from the pulse sequence server 118. The attenuated RF excitation pulses are applied to a power amplifier 214 in each transmitter 200. The power amplifiers 214 are current source devices that connect to respective transmit inputs on a set of transmit/receive switches 216. In this example, a desired number N of the transmitters 200 are employed and connected through a corresponding number N of the transmit/receive switches 216 to a corresponding number N of the coil elements in the RF coil array 136.

The signal produced by the subject is picked up by the coil array 136 and applied to the inputs of the set of receive channels 202. A pre-amplifier 218 in each receiver channel 202 amplifies the signal by an amount determined by a digital attenuation signal received from the pulse sequence server 118 (FIG. 1). The received signal is at or around the Larmor frequency, and this high frequency signal is down converted in a two-step process by a down converter 220, which first mixes the NMR signal with the carrier signal on the line 206, and then mixes the resulting difference signal with a reference signal on a line 222. The down converter NMR signal is applied to the input of an analog-to-digital (A/D) converter 224, which samples and digitizes the analog signal and applies the digital signal to a digital detector and signal processor 226 (e.g., MR receiver). The digital detector and signal processor 226 produces 16-bit in-phase (I) values and 16-bit quadrature (Q) values corresponding to the received signal. Other numbers of bits may be used. The resulting stream of digitized I and Q values of the received signal are output to the data acquisition server 120 (FIG. 1) and/or the data processing server 122. The reference signal as well as the sampling signal applied to the A/D converter 224 are produced by a reference frequency generator 228.

The transmit/receive switches 216 are controlled and directed by the pulse sequence server 118 (FIG. 1) to connect the N transmitters 200 to the N coil elements in the coil array 136 during those parts of the pulse sequence in which an RF field is to be produced. Each transmitter 200 is separately controlled by the pulse sequence server 118 (FIG. 1) to produce an RF field of a desired amplitude, frequency, phase, and envelope at each of the N coil elements. The combined RF fields of the N coil elements produce the prescribed $B_1$ field throughout the region of interest in the subject during the imaging phase of the procedure. Other arrangements for creating the $B_1$ field in MR may be used.

When the $B_1$ field is not produced, the pulse sequence server 118 directs the transmit/receive switches 216 to connect each of the N receive channels to the respective N coil elements. Signals produced by the excited spins in the subject are picked up and separately processed, as described above.

Figure 3:
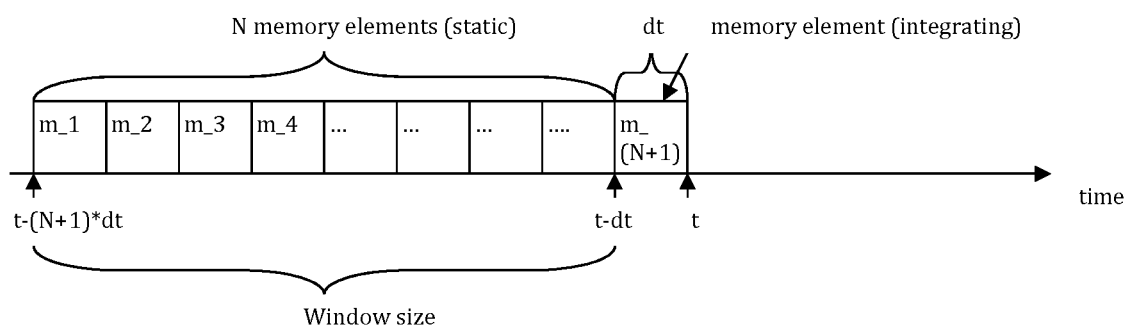
FIG. 3 illustrates a memory allocation chart for one embodiment of a method for monitoring specific absorption rate (SAR)

FIG. 3 illustrates a memory allocation chart for one embodiment of a hybrid sliding window method to monitor SAR in the MRI system 100 of FIGS. 1 and 2 or another MRI system. The hybrid sliding window method may be implemented using a processor and a memory of the workstation 110, the data processing server 122, another server of the MRI system 100, or a separate hybrid averaging unit in communication with the workstation 110. The hybrid averaging unit may include, for example, one or more field-programmable gate arrays (FPGAs) including the processor and the memory.

FIG. 3 shows a window that includes N memory elements. The number N is smaller than the window size divided by the sampling time (e.g., 10 s/10 ms). The window size and the sampling time (e.g., a first time interval) may, for example, be set by the user via the workstation. The number N of memory elements is defined by a tolerable overestimation (e.g., N=100 for 1% allowed overestimation). The overestimation is defined by the time interval needed to acquire all data for memory element N+1 (e.g., dt in FIG. 3) in comparison with the size of the entire sliding window (e.g., N*dt in FIG. 3). The overestimation may be defined by a user of the MRI system. For example, the user may define the number N of memory elements to be included in the window at, for example, the workstation 110 and may thus define the overestimation. Alternatively, the overestimation may be preset within the MRI system 100 and may not be changeable within the MRI system 100.

Each of the N+1 memory elements is operable to store a number k of data points or samples (e.g., measured RF power or calculated SAR values). When a new sample is received (e.g., measured RF power), the new sample is added to the memory element N+1 (e.g., added to the sum stored at the memory element N+1 or added as a separate data point). After each addition of a new sample to the memory element N+1, the samples stored in the memory element N+1 are averaged (e.g., power calculation) or integrated over time (e.g., energy calculation). The N elements within the window are treated statically in that values of the data points stored in the N memory elements may change only once every time period dt (e.g., a second time interval). Also, the sum of the values of the data points stored in the N memory elements (e.g., for an average calculation) or the integral of the values of the data points stored in the N memory elements over time may only be calculated once every time period dt.

After each addition of a new sample, an overall average value or an overall integration result value is calculated. For example, after each addition of a new sample, the sum of the samples stored in the N memory elements (e.g., precalculated once every time period dt) is added to the sum of the samples stored in the N+1 memory element. This overall sum is then divided by the number of samples stored in the N memory elements to determine an overall average. The number of samples represented or stored in the N memory elements may be constant once the hybrid sliding window method has been executed for a time period longer than the window size. In one embodiment, an average of the samples stored in a memory element is calculated for each of the N memory elements of the window and stored in the corresponding memory element (e.g., memory element averages) once every time period dt. After each addition of a new sample to memory element N+1 (e.g., to the sum value stored at memory element N+1) and the calculation of the average of the samples stored in memory element N+1, a sum of the memory element averages for the N memory elements is added to the calculated average of the samples stored in the memory element N+1 and divided by the number N of memory elements in the window. Dividing by the number N of memory elements in the window provides the over-estimation of the average value.

The overall average value or the overall integral is compared with a limit value (e.g., defined by IEC standards) after each addition of a new sample to memory element N+1. When the overall average value, for example, exceeds the limit value, the processor may reset the MRI system into a safe mode (e.g., turn the MRI system off). When the overall average value, for example, is less than the limit value, the MRI system continues to operate, and the processor continues to execute the hybrid sliding window method to monitor SAR in the MRI system.

A window update occurs after a time period of the window size divided by the number N of memory elements in the window. For example, for a window size of 10 s and a number N of memory elements of 100, a window update occurs every 100 ms. Other window sizes and other numbers N of memory elements may be used. With the window update, content of all memory elements are moved from memory element i to i−1, and the data points stored in the memory element N+1 are set to zero. For example, every 100 ms, for example, content of memory element N+1 is moved to memory element N, content of memory element N is moved to memory element N−1, and so on. After the window update, the content of a first memory element (e.g., m_1 in FIG. 3) is no longer included in the calculation of the overall average. Other memory management without moving all memory elements may be provided (e.g., using pointers).

Figure 4:
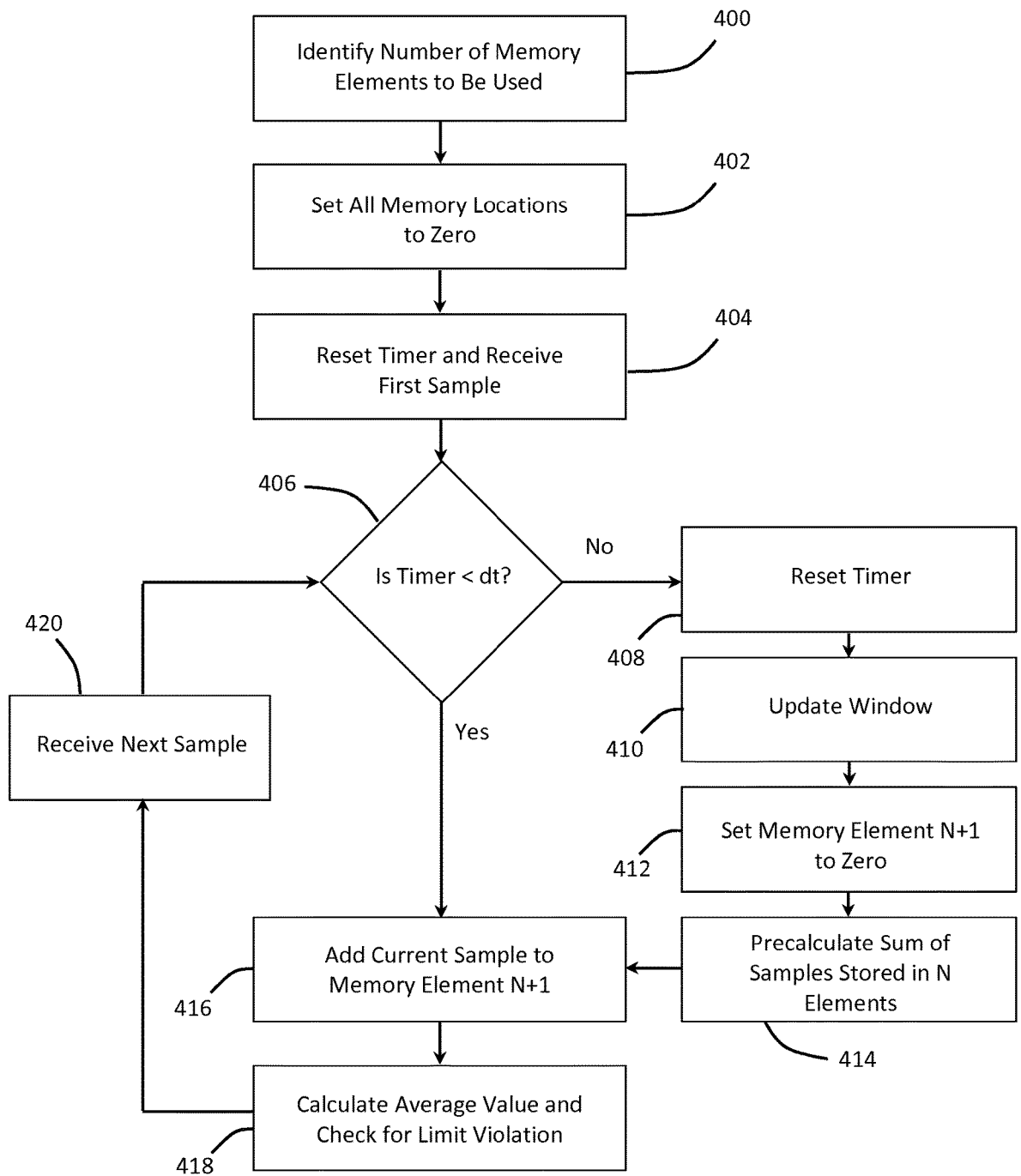
FIG. 4 illustrates a flowchart of one embodiment of a method for monitoring SAR.

FIG. 4 shows a flowchart of one embodiment of a method for monitoring SAR within an MRI system. The method may be performed using the MRI system 100 of FIGS. 1 and 2 or another MRI system. For example, the method may be performed by a processor of the workstation 110, the data acquisition server 120, the data processing server 122, or another server, or another processor of the MRI system 100. The method is implemented in the order shown, but other orders may be used. Additional, different, or fewer acts may be provided. Similar methods may be used for monitoring SAR in an MRI system.

In act 400, a number of memory elements to be used for monitoring the SAR within the MRI system are identified. The number of memory elements may be at least partially defined by a tolerable overestimation. For example, the inverse of the maximum tolerable overestimation represented as a decimal (e.g., 0.01 for 1.0% overestimation) may provide the number N of memory elements to be used in the window. The total number of memory elements for the method for monitoring SAR is N memory elements plus one. The memory elements represent static memory elements, while the memory element N+1 represents a dynamic memory element.

A user of the MRI system may input data representing the number of memory elements to be used at the workstation 110, for example, and the processor may calculate the associated overestimation. Alternatively, the user may input the maximum tolerable overestimation at the workstation 110, and the processor may calculate the number of memory elements to be used. In one embodiment, the maximum tolerable overestimation is preset within the MRI system prior to delivery to the user, and the user is not able to change the maximum tolerable overestimation and thus the number of memory elements to be used.

In act 402, data points stored in the memory elements are all set to zero. The processor may set all of the data points stored in the identified number of memory elements to zero prior to monitoring the SAR in the MRI system. In other embodiments, the processor sets all of the data points stored in the memory elements to zero when the MRI system is turned on or after a predetermined amount of time once an MRI scan ends.

In act 404, a timer is reset, and a first sample is received. The timer may be reset and run when an MRI scan begins. The first sample may be, for example, data representing measured RF power received from the RF system 128 (e.g., from an output of a power amplifier 214 of the RF system 128). The data representing the RF power received from the RF system 128 may be for a single transmit channel of the RF system 128 or may represent a sum over all transmit channels of the RF system 128. Once the MRI scan begins, the RF system 128, for example, may measure the RF power (e.g., a sample) every predetermined sampling interval (e.g., a sampling rate) and send the measured sample to the processor. Other data may be sent to and received by the processor for monitoring of the SAR in the MRI system 100. The sampling interval may be set by the user at the workstation 110, for example. In one embodiment, the sampling interval is 10 ms. Any number of other sampling intervals may be set.

In act 406, the processor determines whether an elapsed time of the timer is less than a time period dt. The measured sample is added to the actual value in the element N+1 each time the sample arrives, and the value in element N+1 is overwritten by this summed value so that only one data point is stored in the element N+1 (see act 416). Alternatively, each received sample is stored in the element N+1, and the stored samples are summed once every sampling interval.

If the elapsed time of the timer is greater than the time period dt, the method moves to act 408. In act 408, the timer is reset. The timer may be restarted after the timer is reset (e.g., restarted after acts 410-414 are completed or directly after the reset).

In act 410, the window is updated. In other words, the N memory elements that make up the window are updated. The N memory elements that make up the window may be referred to as static memory elements in that the N memory elements are only updated once every dt. The N+1 memory element may be referred to as a dynamic memory element in that the N+1 memory element is updated once every sampling interval.

Once every elapsed time period dt the window is updated. When the window is updated, the data stored in memory element i is moved to memory element i−1. For example, the data stored in memory element N+1 is moved to memory element N, the data stored in the memory element N is moved to memory element N−1, the data stored in the memory element N−1 is moved to memory element N−2, and so on. After the window update, the data stored in a first memory element of the N memory elements prior to the window update is no longer stored in the window. This represents the sliding portion of the hybrid sliding window method. In one embodiment, the memory element 1 is overwritten by the value of element N+1, and the start of the static memory window is marked by a pointer that points to element 2. The moving of the memory window and time consuming memory operations may thus be avoided.

In act 412, the value of memory element N+1 is set to zero. In other words, the value stored in the dynamic memory element is reset to zero.

In act 414, a sum of samples stored in the N memory elements making up the window is calculated. Once every elapsed time period dt, values of the samples stored in the N memory elements are summed. Alternatively, the values of the samples may be integrated over time to determine a total energy over the window.

In act 416, the current sample (e.g., current measurement value) is added to the value of memory element N+1. When the method is first started, the current sample is the first sample stored at memory element N+1, so the value of memory element N+1 equals the value of the current sample. Otherwise, the current sample is a subsequent sample received from the RF system (e.g., RF system 128) after the sampling interval, and is added to the value of memory element N+1.

In act 418, an overall average is calculated. The overall average is calculated once every sampling interval. A sum of samples is calculated once every sampling time interval, and a result of the summing is stored in the N+1 memory element or another memory element. The overall average may be based on a total sum. The processor may calculate the total sum by adding the sum of the samples stored in the N memory elements making up the window calculated in act 414 to the sum of the samples stored in the N+1 memory element calculated in act 416. The processor may calculate the overall average value by, for example, dividing the total sum by a total number of data points represented or stored in the N memory elements (e.g., N*k).

In one embodiment, the processor may calculate the total sum by adding memory element averages calculated for each of the N memory elements once every dt time period to a memory element average calculated for the N+1 memory element once every sampling interval. The processor may calculate the overall average value by, for example, dividing the total sum by the number N of memory elements in the window.

In another embodiment, the processor may calculate the total sum by summing the result of integrating the values of the samples stored in the N memory elements over time and the result of integrating the values of the samples stored in the N+1 memory element over time. The processor may calculate the overall average value by, for example, dividing the total sum by the window size (e.g., 10 s). The average value for the window may be calculated in any number of other ways. By dividing by the number of data points in the window, the number of memory elements representing the window, or the time the window represents, the user-defined overestimation is provided.

The processor uses the overall average of the samples stored in the window to calculate a representation of SAR in the MRI system. The representation of SAR in the MRI system may be global SAR, local SAR, partial body SAR, or a different representation of SAR. SAR is based on the frequency-dependent conductivity of the tissue, the electric field, the tissue density, and scales with the square of the main magnetic field and with the square of the flip angle. One representation of SAR may be calculated, for example, by averaging the RF power absorbed per unit mass over the exposed tissue (e.g., the whole body). Simulations may be used to calculate the representation of SAR based on the overall average of the samples.

The processor compares the calculated representation of SAR to a predetermined limit defined by IEC standards. The predetermined limit may be stored in the memory of one of the servers or a workstation, for example. When the calculated representation of SAR exceeds the predetermined limit, the processor may reset the MRI system into a safe mode (e.g., turn the MRI system off). When the calculated representation of SAR is less than the predetermined limit, the method moves on to act 420.

In act 420, the next sample is received after the sampling time interval, and the method is moved back to act 406. The method may continue until the MRI scan is complete or until the scanner is switched off. In one embodiment, the method may continue for a predetermined amount of time.

The hybrid sliding window method used to monitor SAR in an MRI system provides a number of advantages. The hybrid sliding window method significantly reduces, compared to the prior art, the memory footprint used. This allows simpler and therefore cheaper components (e.g., memory elements) to be used. Using the simpler and cheaper components, very high update rates may still be used. Also, average values are not underestimated using the hybrid sliding window method, and maximum over-estimation may be user defined.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for monitoring specific absorption rate (SAR) in a magnetic resonance imaging (MRI) system, the method comprising:

identifying a number of memory elements to be used, the memory elements comprising at least one static memory element and a dynamic memory element, a value stored in the dynamic memory element being changeable once every first time interval, a value stored in the at least one static memory element being changeable once every second time interval of a repeating number of second time intervals during an MRI scan, the second time intervals being greater than the first time intervals;

receiving a measured value once each first time interval during a respective second time interval;

processing the measured value and storing a result of the processing in the dynamic memory element after each first time interval;

moving, with a processor, the result of the processing stored in the dynamic memory element to one of the at least one static memory element when the respective second time interval is reached; and setting all values stored in the dynamic memory element to equal zero when or after the respective second time interval is reached.

2. The method of claim 1, wherein the processing comprises integrating the measured values in the dynamic memory over time after each first time interval.

3. The method of claim 2, wherein the integral of the measured values in the dynamic memory is a first integration, and wherein the method further comprises:
when or after the respective second time interval is reached:
integrating values stored in the at least one static memory over time, the integral of the measured values stored in the at least one static memory being a second integration; and
calculating a representation for SAR based on the first integration and the second integration.

4. The method of claim 3, further comprising comparing the representation for SAR to a predetermined SAR limit.

5. The method of claim 1, wherein the processing comprises determining, every first time interval, a sum of the measured values received during the respective second time interval, and storing the sum in the dynamic memory element after each first time interval, the determining of the sum comprising adding the measured value to a value stored at the dynamic memory element, the result of the processing being the sum of the measured values received during the respective second time interval.

6. The method of claim 5, wherein the sum is a first sum, and wherein the method further comprises:
when the respective second time interval is reached:
calculating a second sum, the second sum being a sum of the values stored in the at least one static memory element; and
calculating an average SAR value in the MRI system based on the calculated first sum and the calculated second sum after each first time interval.

7. The method of claim 6, wherein the calculating of the average SAR value in the MRI system comprises dividing a sum of the calculated first sum and the calculated second sum by a total number of data points represented in the at least one static memory element.

8. The method of claim 6, further comprising comparing the calculated average SAR value to a predetermined SAR limit after each first time interval.

9. The method of claim 1, wherein the identifying comprises defining the number of memory elements to be used based on a predetermined tolerable overestimation.

10. The method of claim 1, wherein the receiving comprises receiving a measured radio frequency (RF) power value from an RF system of the MRI system.

11. In a non-transitory computer-readable storage medium that stores instructions executable by one or more processors to monitor specific absorption rate (SAR) in a magnetic resonance imaging (MRI) system comprising a number of memory elements to be used, the instructions comprising:

receiving data representing a value once every first time interval during a respective second time interval, the respective second time interval being one of a repeating number of second time intervals during an MRI scan;

processing the data and storing a value resulting from the processing in a first memory element of the number of memory elements after each first time interval;

calculating a sum based on the value stored in the first memory element and a value stored in a second memory element of the number of memory elements after each first time interval;

moving the value stored in the first memory element to the second memory element when the respective second time interval is reached or exceeded;

setting all values stored in the first memory element to equal zero when or after the respective second time interval is reached or exceeded; and comparing the calculated sum or a representation of SAR in the MRI system calculated based on the sum to a predetermined threshold after each first time interval.

12. The non-transitory computer-readable storage medium of claim 11, wherein the sum is a first sum, and wherein calculating the first sum comprises calculating a second sum and adding the value resulting from the processing to the second sum, the second sum being a sum of values stored in the memory elements of the number of memory elements to be used other than the first memory element.

13. The non-transitory computer-readable storage medium of claim 12, wherein the instructions further comprise:

calculating the representation of SAR in the MRI system based on the first sum for each first time interval; and comparing the representation of SAR in the MRI system to a predetermined SAR limit for each first time interval.

14. The non-transitory computer-readable storage medium of claim 13, wherein the calculating of the representation of SAR comprises calculating a global SAR value, calculating a local SAR value, or calculating a partial body SAR value.

15. The non-transitory computer-readable storage medium of claim 11, wherein the processing comprises adding the value of the received data to a value previously stored at the first memory element.

16. A system for monitoring specific absorption rate (SAR) in a magnetic resonance imaging (MRI) system, the system comprising:

a processor configured to identify a value representative of SAR once every first time interval; and a plurality of memory elements comprising at least one static memory element and a dynamic memory element, a value stored in the dynamic memory element being changeable once every first time interval based on the identified value representative of SAR, a value stored in the at least one static memory element being changeable once every second time interval of a repeating number of second time intervals during an MRI scan, the second time intervals being greater than the first time intervals, wherein the processor is further configured to calculate a representation of SAR in the MRI system each first time interval based on the value stored in the dynamic memory and the value stored in the at least one static memory, and when or after a respective second time interval is reached, change the value stored in one of the at least one static memory element to equal the value stored in the dynamic memory element and set all values stored in the dynamic memory element to equal zero.

17. The system of claim 16, wherein the processor is further configured to:
   when or after the respective second time interval is reached:
      calculate a sum of the values stored in the at least one static memory element and the value stored in the dynamic memory element; and
      calculate an average SAR value in the MRI system based on the calculated sum.

18. The system of claim 17, wherein the processor is further configured to compare the calculated average SAR value to a predetermined SAR limit after each first time interval.

19. The system of claim 18, wherein the processor is configured to reset the MRI system to a predetermined safe mode when the calculated average SAR value is greater than the predetermined SAR limit.

20. The system of claim 16, further comprising one or more field-programmable gate arrays, the one or more field-programmable gate arrays comprising the processor and the memory.

21. A method for monitoring specific absorption rate (SAR) in a magnetic resonance imaging (MRI) system, the method comprising:

identifying a number of memory elements comprising at least one static memory element and a dynamic memory element, wherein a value stored in the dynamic memory element is changeable every first time interval, and at least one value stored in the at least one static memory element, respectively, is changeable every second time interval of a repeating number of second time intervals during an MRI scan, wherein the second time intervals are greater than the first time intervals;

receiving a measured value every first time interval during a respective second time interval;

processing the measured value and storing a value resulting from the processing in the dynamic memory element every first time interval until the respective second time interval is reached;

calculating, with a processor, a representation of SAR in the MRI system based on the at least one value stored in the at least one static memory element and the value stored in the dynamic memory element after each first time interval;

moving, with the processor, the value stored in the dynamic memory element to one of the at least one static memory element when or after the respective second time interval is reached; and setting all values stored in the dynamic memory element to zero when or after the respective second time interval is reached, wherein calculating the representation of SAR in the MRI system comprises calculating an average of the measured values received during the respective second time interval.

22. The method of claim 21, wherein receiving the measured value comprising receiving a measured radio frequency (RF) power value from an RF system of the MRI system.

* * * * *